(12) United States Patent
Zheng

(10) Patent No.: US 6,782,019 B2
(45) Date of Patent: Aug. 24, 2004

(54) VCSEL WITH HEAT-SPREADING LAYER

(75) Inventor: Jun Zheng, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 70 days.

(21) Appl. No.: 09/931,669

(22) Filed: Aug. 16, 2001

(65) Prior Publication Data

US 2003/0039284 A1 Feb. 27, 2003

(51) Int. Cl.$^7$ .............................................. H01S 3/19
(52) U.S. Cl. .............................. 372/45; 372/46; 372/43
(58) Field of Search .......................................... 372/45

(56) References Cited

U.S. PATENT DOCUMENTS

| | | | | |
|---|---|---|---|---|
| 5,136,603 A | * | 8/1992 | Hasnain et al. | 372/50 |
| 5,285,466 A | * | 2/1994 | Tabatabaie | 372/50 |
| 5,331,658 A | | 7/1994 | Shieh et al. | |
| 5,475,701 A | * | 12/1995 | Hibbs-Brenner | 372/50 |
| 5,577,064 A | * | 11/1996 | Swirhun et al. | 372/96 |
| 5,606,572 A | * | 2/1997 | Swirhun et al. | 372/96 |
| 5,642,371 A | | 6/1997 | Tohyama et al. | |
| 5,648,979 A | | 7/1997 | Mun et al. | |
| 5,732,101 A | | 3/1998 | Shin | |
| 5,748,661 A | | 5/1998 | Kiely et al. | |
| 5,757,836 A | | 5/1998 | Jiang et al. | |
| 5,757,837 A | | 5/1998 | Lim et al. | |
| 5,774,486 A | | 6/1998 | Jiang et al. | |
| 5,812,582 A | | 9/1998 | Gilliland | |
| 5,821,566 A | | 10/1998 | Kang | |
| 5,892,786 A | | 4/1999 | Lott | |
| 5,914,973 A | * | 6/1999 | Jiang et al. | 372/36 |
| 5,953,355 A | | 9/1999 | Kiely et al. | |
| 6,023,485 A | | 2/2000 | Claisse et al. | |
| 6,037,644 A | | 3/2000 | Daghighian et al. | |
| 6,057,560 A | * | 5/2000 | Uchida | 257/94 |
| 6,151,344 A | | 11/2000 | Kiely et al. | |
| 2002/0090016 A1 | * | 7/2002 | Coldren et al. | 372/96 |

OTHER PUBLICATIONS

Hasnain et al., "Monolithic Integration of Photodetector with Vertical Cavity Surface Emitting Laser," *Electronics Letters*, vol. 27, No. 18, (1991), pp. 1630–1632.

* cited by examiner

*Primary Examiner*—Don Wong
*Assistant Examiner*—Dung T Nguyen
(74) *Attorney, Agent, or Firm*—N. Stephan Kinsella

(57) ABSTRACT

The present invention is directed to a method and VCSEL for improved heat removal/dispersion. The VCSEL comprises a bottom mirror, an active region disposed on the bottom mirror, a heat spreading layer disposed on the active region, and a top mirror disposed above the heat spreading layer. The heat spreading layer may be composed of InP.

10 Claims, 4 Drawing Sheets

VCSEL WITH HEAT-SPREADING LAYER

BACKGROUND OF THE INVENTION

1. Field of the Invention

This invention relates generally to surface-emitting lasers and, in particular, to removal of heat generated in the active region of vertical-cavity surface-emitting lasers (VCSELs).

2. Description of the Related Art

The following descriptions and examples are not admitted to be prior art by virtue of their inclusion within this section.

Lasers have a wide range of industrial and scientific uses. There are several types of lasers, including gas lasers, solid-state lasers, liquid (dye) lasers, and free electron lasers. Semiconductor lasers are also in use. The possibility of amplification of electromagnetic waves in a semiconductor superlattice structure, i.e., the possibility of semiconductor diode lasers, was predicted in a seminal paper by R. F. Kazarinov, et al., "Possibility of the Amplification of Electromagnetic Waves in a Semiconductor with a Superlattice," *Soviet Physics Semiconductors*, vol. 5, No. 4, pp. 707–709 (October 1971). Semiconductor laser technology has continued to develop since this discovery.

There are a variety of types of semiconductor lasers. Semiconductor lasers may be diode lasers (bipolar) or non-diode lasers such as quantum cascade (QC) lasers (unipolar). Semiconductor lasers of various types may be electrically pumped (EP) (by a DC or alternating current), or pumped in other ways, such as by optically pumping (OP) or electron beam pumping. Semiconductor lasers are used for a variety of applications and can be built with different structures and semiconductor materials, such as gallium arsenide (GaAs).

Semiconductor lasers are typically powered by applying an electrical potential difference across the active region, which causes a current to flow therein. Electrons in the active region attain high energy states as a result of the potential applied. When the electrons spontaneously drop in energy state, photons are produced (to carry away the energy lost by the transition, so as to conserve energy). Some of those photons travel in a direction perpendicular to the reflectors of the laser. As a result of the ensuing reflections, the photons can travel through the active region multiple times.

Stimulated emission occurs when an electron is in a higher energy level and a photon with an energy equal to the difference between the electron's energy and a lower energy interacts with the electron. In this case, the photon stimulates the electron to fall into the lower energy state, thereby emitting a photon. The emitted photon will have the same energy as the original photon, and, if viewed as waves, there will be two waves emitted (from the electron's atom) in phase with the same frequency. Thus, when the photons produced by spontaneous electron transition photons interact with other high energy state electrons, stimulated emission can occur so that two photons with identical characteristics are present. If most electrons encountered by the photons are in the high energy state, the number of photons traveling between the reflectors tends to increase, giving rise to amplification of light and thus lasing.

The use of semiconductor diode lasers for forming a source of optical energy is attractive for a number of reasons. For example, diode lasers have a relatively small volume and consume a small amount of power as compared to conventional laser devices. Further, the diode laser is a monolithic device, and does not require a combination of a resonant cavity with external mirrors and other structures to generate a coherent output laser beam.

Additionally, semiconductor lasers may be edge-emitting lasers or surface-emitting lasers (SELs). Edge-emitting semiconductor lasers output their radiation parallel to the wafer surface, while in SELs, the radiation output is perpendicular to the wafer surface. One type of SEL is the vertical-cavity surface-emitting laser (VCSEL).

The VCSEL structure usually consists of an active (optical gain) region sandwiched between two mirrors, such as distributed Bragg reflector (DBR) mirrors: a top, exit DBR, and a bottom DBR. DBRs are sometimes referred to as mirror stacks. DBRs or mirror stacks in VCSELs are typically formed of multiple pairs of layers referred to as mirror pairs. The pairs of layers are formed of a material system generally consisting of two materials having different indices of refraction and being easily lattice matched to the other portions of the VCSEL. The number of mirror pairs per stack may range from 20–40 pairs to achieve a high percentage of reflectivity, depending on the difference between the refractive indices of the layers. A larger number of mirror pairs increases the percentage of reflected light (reflectivity). The DBR mirrors of a typical VCSEL can be constructed from dielectric or semiconductor layers (or a combination of both, including metal mirror sections). The difference between the refractive indices of the layers of the mirror pairs can be higher in dielectric DBRs, generally imparting higher reflectivity to dielectric DBRs than to semiconductor DBRs for the same number of mirror pairs and overall thickness. Conversely, in a dielectric DBR, a smaller number of mirror pairs can achieve the same reflectivity as a larger number in a semiconductor DBR. However, it is sometimes necessary or desirable to use semiconductor DBRs, despite their lower reflectivity/greater thickness, to conduct current, for example (e.g., in an EP VCSEL). Semiconductor DBRs also have higher thermal (heat) conductivity than do dielectric DBRs, making them more desirable for heat-removal purposes, ceteris paribus.

When properly designed, these mirror pairs will cause a desired reflectivity at the laser wavelength. Typically in a VCSEL, the mirrors are designed so that the bottom DBR mirror (i.e. the one interposed between the substrate material and the active region) has nearly 100% reflectivity, while the top DBR mirror has a reflectivity that may be 98%–99.5% (depending on the details of the laser design). Of course, various laser structures may vary from these general properties.

VCSELs have many attractive features such as low threshold current, single longitudinal mode, and a circular output beam, among others. Additionally, because the output is perpendicular to the wafer surface, it is possible to test fabricated VCSELs on the wafer before extensive packaging is done, in contrast to edge-emitting lasers, which must be cut from the wafer and packaged to an extent necessary to test the laser.

Referring now to FIG. 1, there is shown a cross-sectional view of the layer structure of a VCSEL array 100, to illustrate heat removal from the active region of a VCSEL 110 of the array 100 (not to scale). VCSEL 110 comprises a bottom DBR 113 (part of layer 103), an active region section 114 (part of active region layer 104), and a top DBR 115 (which may also be part of a top DBR layer (not shown)). These parts of VCSEL 110 are disposed on substrate layer 102, which is mounted on submount 101. Active region 114 is pumped with some form of pumping energy (e.g., light from pump laser 118) and coherent light 119 is emitted vertically out of the top DBR 115.

During operation, the active region of the VCSEL generates heat, whether it is electrically pumped (EP) or optically pumped (OP). Heat is generated in active region 114, e.g., due to the pumping energy applied thereto, and also because the active region is not 100% efficient in converting the pumping energy to output light. For example, when electrons fall into a lower energy state without emitting a photon, heat is generated.

It is important to maintain the active region at or below a specified threshold temperature, and/or to maintain the active region at as low a temperature as possible. One reason for this is to prevent damage to the VCSEL 110. Another reason is that, generally, a semiconductor laser operates with higher gain—and thus more efficiently—at lower temperatures. Thus, for example, at a lower active region temperature, a higher pumping energy may be applied to give rise to a higher output power laser beam than would be possible at a higher active region temperature. For example, a typical OP VCSEL, with the submount maintained at 50° C., might stop lasing when pumped at 70 mW, and may be optimally pumped at a maximum of 50 mW. However, if the same OP VCSEL structure has its submount maintained at 20° C., it might stop lasing when pumped at 100 mW, and may be optimally pumped at a maximum of 70 mW, therefore providing for a higher maximum output power.

Accordingly, heat must be removed from active region 114, to control the temperature of the active region. As indicated by curved arrows emanating from active region 114 in FIG. 1, the heat from active region 114 flows away from the active region, e.g. through the bottom DBR 113, through substrate 102, and into submount 101 (which may be coupled, e.g., to a TE (thermoelectric) cooler).

BRIEF DESCRIPTION OF THE DRAWINGS

Other features and advantages of the invention will become apparent upon study of the following description, taken in conjunction with the attached FIGS. 1–7.

DETAILED DESCRIPTION OF THE INVENTION

In the present invention, a layer of heat-conductive material is disposed directly on top of the active region of a VCSEL, between the active region and the top (exit) DBR, to facilitate heat removal from the active region. This heat-conducting layer may be referred to herein as a heat-spreading, or thermal, layer. The top DBR may be disposed directly on top of the heat-spreading layer or externally mounted above the thermal layer with a gap therebetween (in the case of either an EP or OP VCSEL). The heat-spreading layer has a thermal (heat) conductivity sufficient to conduct heat, preferably having a thermal conductivity high enough to effectively conduct heat generated in and received from the active region and to convey said heat away from the active region so that the temperature of the active region of the operating VCSEL is lowered. The thermal conductivity of the heat-spreading layer is preferably higher than that of the active region and also higher than that of the top DBR or any other layer that would normally be directly disposed on top of the active region in cases where the heat-spreading layer is not employed.

OP VCSEL Array

Figure 2:
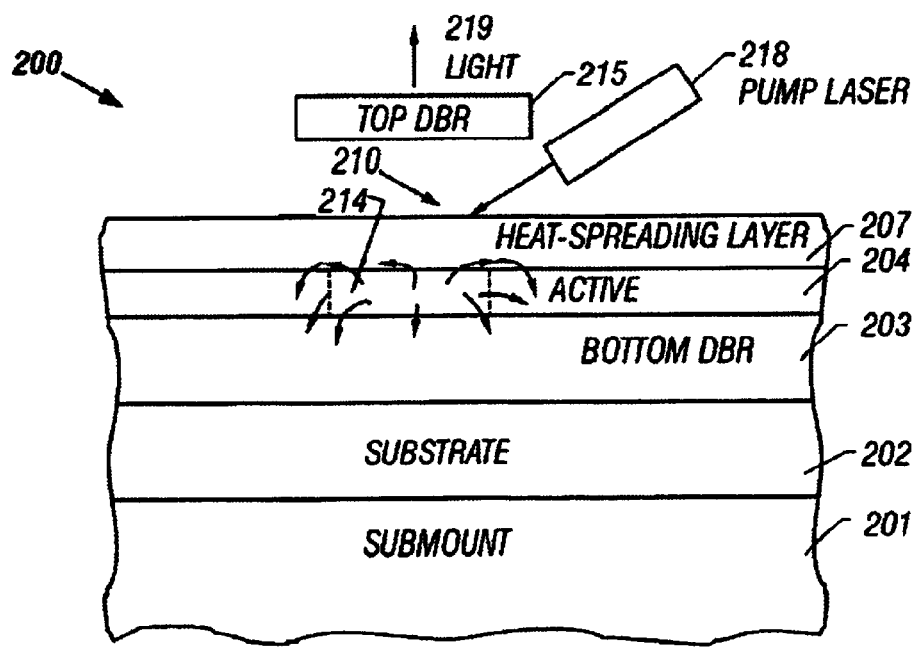
FIG. 2 is a cross-sectional view of the layer structure of an array of OP VCSELs having a heat spreading layer, in accordance with an embodiment of the present invention.

Referring now to FIG. 2, there is shown a cross-sectional view of the layer structure of an OP VCSEL array 200 having a heat-spreading layer 207, in accordance with an embodiment of the present invention (FIG. 2 not to scale). Array 200 comprises a plurality of OP VCSELs, including VCSEL 210. VCSELs of the array are preferably substantially identical to each other, each comprising features essentially identical to those of VCSEL 210. In an alternative embodiment, a single OP VCSEL 210 may be employed, instead of an array of VCSELs.

As will be appreciated, an array of OP VCSELs may be formed by: providing an essentially homogenous (in horizontal directions) multi-layer structure comprising bottom DBR layer 203 and active region layer 204 disposed on a substrate 202 and submount 201; pumping a substantially cylindrical section of the active region for each VCSEL with a pump laser; and providing a top DBR for completing a laser cavity for each such VCSEL. For example, by directing light from a pump laser 218 onto a particular portion of array 200 (through transparent heat-spreading layer 207), an active region 214 (a portion of active region layer 204) is formed. A circular light beam from pump laser 218 can be directed to pump a substantially cylindrical active region portion 214 of active region layer 204. DBR 215 is positioned over active region 214, so that top DBR 215 and bottom DBR 203 form a cavity, causing light 219 to be produced from VCSEL 210.

In an embodiment, bottom DBR 203 is an undoped semiconductor DBR, since doped semiconductor DBRs have reduced reflectivity compared to undoped semiconductor DBRs, and also because such semiconductor DBRs may be fabricated epitaxially. In alternative embodiments, bottom DBR 203 is a dielectric DBR (e.g., $Si/SiO_2$), or a doped semiconductor DBR.

In an embodiment, top DBR 215 (and a similar top DBR for each other VCSEL of the array 200) is a dielectric DBR (e.g., $Si/SiO_2$) and is mounted externally, with an air gap between top DBR 215 and heat-spreading layer 207. In other embodiments, instead of air, a controlled environment enclosing array 200 may be employed to provide an inert gas such as argon or nitrogen, or a vacuum, in the gap between top DBR 215 and active layer 204. In an alternative embodiment, the distance between top DBR 215 and heat-spreading layer 207 is zero, i.e. it is monolithically grown on top of heat-spreading layer 207. In this latter embodiment, light from a pump laser 218 is directed through the top DBR 215 and heat-spreading layer 207, into active layer 204, to form active region 214.

Array 200 comprises a plurality of layers, including substrate 202 mounted on submount 201, bottom DBR layer 203 disposed on substrate 202, active region layer 204 disposed on bottom DBR 203, and heat-spreading layer 207 disposed on active region layer 204. Active region layer 204 includes the active region 214 and active region layer portions outside the active region 214. Heat-spreading layer 207 thus is directly disposed on the top surface of active region 214, and also on other material of the array outside the VCSEL active region 214 itself, namely on the top surface of portion of the active region layer 204 outside the active region 214. Thus, heat-spreading layer can receive and remove heat from the top of active region 214, and carry it to other material of the array outside the VCSEL 210 and active region 214.

Other layers may also be employed instead of or between the depicted layers, in alternative embodiments. For example, a metal mirror layer may be disposed between bottom DBR layer 203 and substrate 202, to enhance overall reflectivity of the bottom mirror for the VCSELs of the array. In this case, a thin layer (e.g., of $SiO_2$) may be disposed on the metal mirror, between the metal mirror and the bottom DBR layer 203 to isolate the bottom DBR from the metal mirror layer during fabrication.

Each VCSEL comprises a respective (preferably cylindrical) portion of the common layers of the array. For example, the cylindrical portion of active region layer 204 which is optically pumped by pump laser 218 (or electrically pumped, in alternative embodiments), is the active region (214) of VCSEL 210. Thus, VCSEL 210 comprises a bottom mirror (bottom DBR 203), the active region 214, and a top mirror (top DBR 215). These components form a gain medium plus a laser cavity. The bottom mirror (bottom DBR 203) and top mirror (top DBR 215) at least partially reflect light at certain wavelengths or within certain wavelength ranges, namely the wavelength(s) of light to be emitted by the active region 214. The bottom mirror typically has a reflectivity as high as possible, e.g. at least 99.9%; and the top mirror typically has a high reflectivity slightly smaller than that of the bottom mirror, so that it serves as the exit mirror, e.g. a reflectivity of at least 99.5%. Other reflectivities and ranges may be employed.

As will be appreciated, the fabrication process in which semiconductor devices, including optoelectronic devices, are fabricated on a substrate can include epitaxial growth techniques such as molecular beam epitaxy (MBE), liquid phase epitaxy (LPE), or a vapor phase epitaxy (VPE) process such as or metalorganic chemical vapor deposition (MOCVD, also known as MOVPE); or deposition techniques such as e-beam evaporation, thermal evaporation, or sputtering. The materials grown or deposited to fabricate various structure and devices can include semiconductor materials and dielectrics.

In an embodiment, an epitaxial growth technique such as MBE is employed to dispose layers on others in the present invention. Thus, bottom DBR 203 is disposed (e.g., by MBE) on substrate 202, which is itself mounted on submount 201. Disposed on bottom DBR 203 is active region layer 204. Heat-spreading (thermal) layer 207 is disposed, preferably directly (i.e., with no intervening layers), on top of active region layer 204 (and thus on top of active region 214). The top DBR 210 is disposed on top of heat spreading layer 207, either with or without a gap or other, intervening layers between.

In an embodiment, heat-spreading layer 207 is transparent to light (at the desired lasing wavelength), preferably as transparent as the materials that form the active region and bottom and top DBRs; and is a relatively good conductor of heat, preferably having a thermal conductivity greater than that of the active region layer 204, and preferably higher than that of any layer disposed on the heat-spreading layer which would have otherwise been directly in contact with active region 204 in the absence of heat-spreading layer 207. For example, in a conventional VCSEL, there is directly in contact with the top surface of the active region, either another layer (such as the bottom portions of a top DBR monolithically integrated with the VCSEL) or the gas between the active region and the top DBR. The heat-spreading layer preferably has substantially greater thermal conductivity than either such a monolithic top DBR or any gas in a VCSEL, so that heat is more effectively removed and transported from the top surface of active region 214 than would otherwise be the case in the absence of heat-spreading layer 207. The heat-spreading layer is also thick enough to remove a not-insubstantial amount of heat from active region 214. Thus, heat-spreading layer is adapted so that it can take heat away from active region 214 and carry it to other parts of the array.

As illustrated by arrows emanating from active region 214, some of the heat generated in active region 214 is removed from the top surface of active region 214 into heat-spreading layer 207, and then carried or "spreaded" horizontally by heat-spreading layer 207 away from the active region 214, and then into the layer structures of array 200 outside of VCSEL 210 (e.g., into the parts of active region layer 204 outside active region 214, between VCSELs of the array, down through the unused part of bottom DBR layer 203, and then into the substrate 202 and submount 201).

In an embodiment, heat-spreading layer 207 consists of InP and is approximately 1 μm (micron) thick. In other embodiments, the InP layer 207 can have other thicknesses within the range of approximately 1 μm to 4 μm. In other embodiments, the InP layer 207 can have still other thicknesses. As will be appreciated, a thicker heat-spreading layer will tend to conduct more heat away from active region 214. However, a thicker heat-spreading layer will also absorb more light, thus increasing loss and reducing laser efficiency, and will also have higher resistance, causing more heat to be generated (for an EP VCSEL). Additionally, the thicker the heat-spreading layer is, the more it will interfere with (e.g., narrow) the reflectivity profile of the DBRs, thus reducing the tuning and/or lasing range of the VCSEL. Thus, heat-spreading layer 207 is preferably thick enough to remove a not-insubstantial amount of heat from active region 214, and in an embodiment is substantially thicker (e.g., orders of magnitude) than the individual layers of active region 214 and a DBR.

InP is a preferred material in some applications and embodiments because it is non-toxic, can be deposited epitaxially (e.g., MBE) during growth of other structures, and has a high enough heat conductivity to assist in the dissipation and spreading of heat from active region 214 and yet having enough transparency at useful heat-conducting thicknesses (e.g., in the 1 μm to 4 μm range) to not unduly interfere with laser operation. In an embodiment, heat-spreading layer 207 has a thermal conductivity of about 0.68 W/cm/K, which is much higher than that of the active region and the DBR, in both radial and Z directions.

Because some of the heat from active region 214 is removed at the top of active region 214 by heat-spreading layer 207, instead of only at its sides and bottom, as in conventional VCSELs, VCSEL 210 has improved heat removal compared to conventional VCSELs not employing the heat-spreading layer. In addition to helping lower and control the temperature of the active region, the existence of heat-spreading layer 207 also helps to make the temperature in the active region more uniform, thereby further improving the operation and efficiency of VCSEL 210.

Active region layer 204 may consist of a material such as (undoped) InGaAsP/InP (or InAlGaAs/InP) having, for example, eight (8) quantum wells (QWs). DBR 203 may be a DBR formed of approximately 40 periods (mirror pairs) of InGaAlAs/InP mirror pair layers, each such layer having a quarter-wave optical thickness (QWOT), for a given wavelength. For example, for 1550 nm light, the InGaAlAs layers may be approximately 1122 Å thick and the InP layers may be approximately 1224 Å thick. This can yield a reflectivity of about 99.9%. Top DBR 215 can have an independent design, and preferably has a slightly lower reflectivity to permit output EM radiation 219 to escape the laser cavity. A 40 period DBR with these materials may be approximately 9–10 μm thick.

EP VCSEL Array

Figure 3:
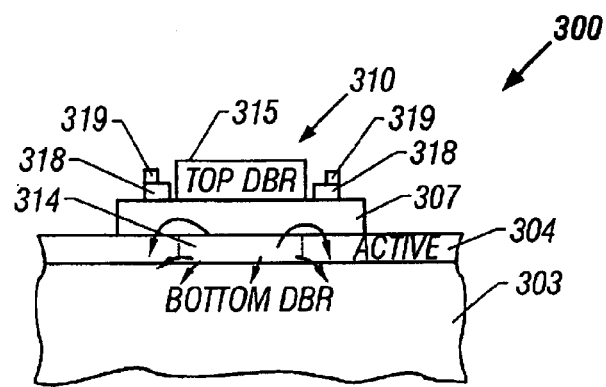
FIG. 3 is a cross-sectional view of the layer structure of an array of EP VCSELs having a heat spreading layer, in accordance with an alternative embodiment of the present invention.

Referring now to FIG. 3, there is shown a cross-sectional view of the layer structure of an array 300 of EP VCSELs (e.g. VCSEL 310) having a heat spreading layer, in accordance with an alternative embodiment of the present invention. Each VCSEL 310 of array 300 comprises a bottom reflector (bottom DBR 303), gain region (active region 304), heat-spreading layer 307, and top reflector (top DBR 315), as well as electrical contact 319, for applying a pumping current thereto. Contact 319 is annular and surrounds the circular top DBR 315 and rests on the outer perimeter of heat-spreading layer 307. Contact 319 may be composed of a metal such as Au. It may be bonded to InP heat-spreading layer 307 via a thin layer 318 of InGaAs, for lower contact resistance. Pumping current is applied to contact 319 to cause current to flow down through heat-spreading layer 307, and into active region layer 304 to form active region 314.

Heat-spreading layer 307 is preferably doped to lower its resistance, e.g. with a doping density of about $5 \times 10^{17}/cm^3$. In alternative embodiments, InP heat-spreading layer 307 is undoped. In this case, contacts 319 may be applied in another suitable manner, e.g. directly to the surface of active layer 304. For example, an annular ring of contact 319 may be provided, separating heat-spreading layer 307 into two portions, an inner, circular portion, and an outer, annular portion. In this case, heat from the top of the active region flows into the inner portion of the heat-spreading layer, then laterally outward, through contact ring 319, and on to the outer, annular portion of heat-spreading layer. In this case, the contact 319 may be considered to be functionally part of heat-spreading layer 307, since its metal can also conduct heat.

In the embodiment illustrated in FIG. 3, top DBR 315 (and a similar top DBR for each other VCSEL of the array 300) is monolithically grown atop the heat-spreading layer 307. In alternative embodiments, the top DBR 315 may be mounted externally, with an air gap between top DBR 315 and heat-spreading layer 307.

In one embodiment, bottom DBR 303 is a doped semiconductor DBR having a doping density of about $5 \times 10^{17}/cm^3$. Semiconductor DBRs may be preferred because it is possible to grow them epitaxially, they can be doped to have lower resistance for electrical pumping, and they can have higher heat conductivity than a dielectric DBR. However, this may require a thick DBR, which can impede heat removal from the bottom of active region 314, thus making the presence of heat-spreading layer 307 even more beneficial.

Simulated Results

Figure 1:
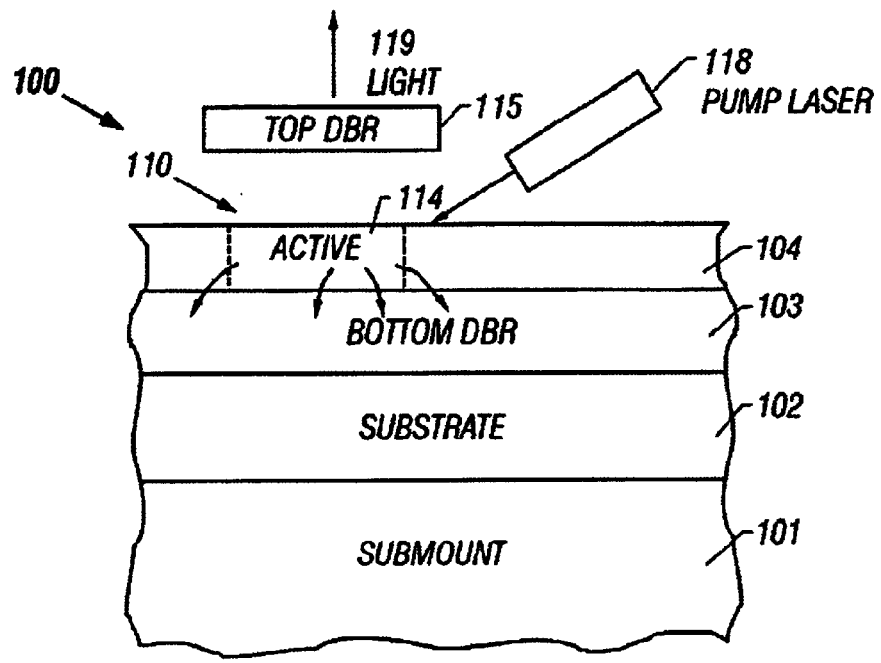
FIG. 1 is a cross-sectional view of the layer structure of a prior art VCSEL array, illustrating heat removal from the active region of a VCSEL of the array 100.
Figure 4:
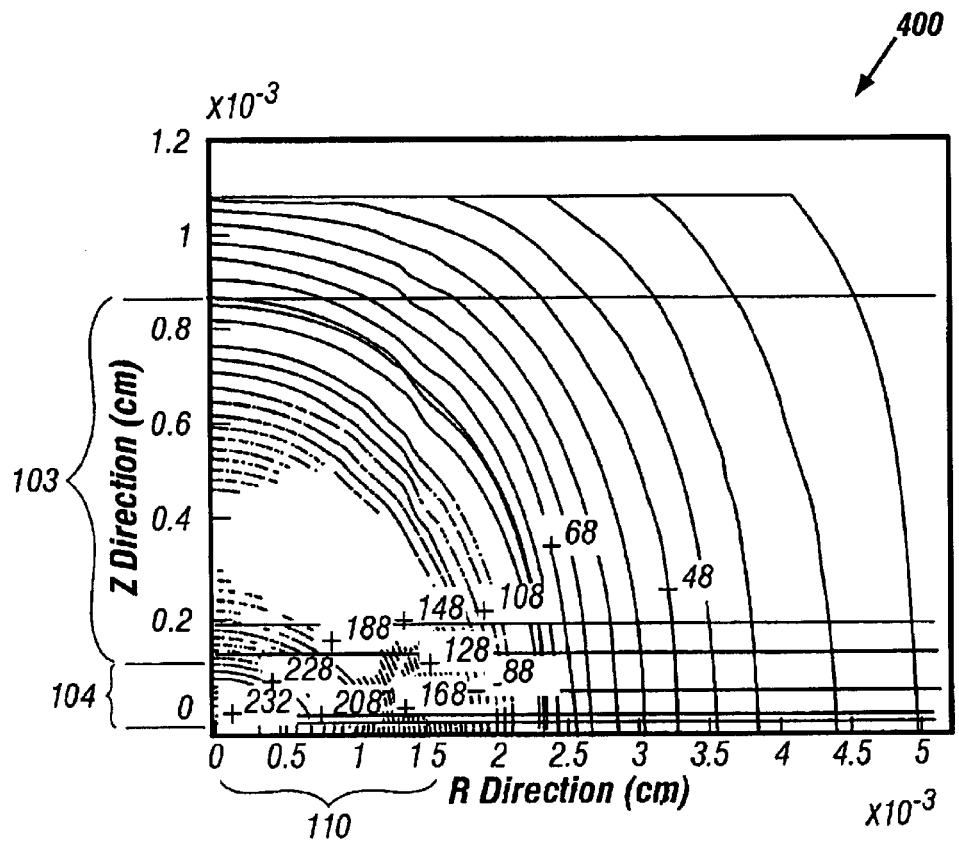
FIG. 4 is a contour diagram plotting simulated temperature in the active and surrounding regions of a conventional OP VCSEL.

Referring now to FIG. 4, there is shown a contour diagram plotting simulated temperature in the active and surrounding regions of a conventional OP VCSEL, such as one similar to OP VCSEL 110 of FIG. 1, not having a heat-spreading layer. The plot of diagram 400 was generated by simulation of a VCSEL similar to VCSEL 100, having the following assumed parameters and properties: submount 101 is copper (Cu) and is approximately 2000 μm thick; substrate 102 consists of InP and is approximately 100 μm thick (and is mounted to submount 101 via a 10 μm In mounting layer); bottom DBR 103 is a semiconductor DBR composed of 40 mirror pair layers and is approximately 9.5 μm thick; and active region layer 104 is approximately 1.2 μm thick. Other assumptions made for the simulation resulting in contour diagram 400 are the thermal conductivity parameters (in W/cm/K) shown in Table 1 below, in the R (radial) direction from the center of the pumping (active) region 114 (indicated on the horizontal axis of diagram 400), which is about 30 μm in diameter, and in the Z direction, downward from the top surface of the active region layer 104 into the bottom DBR 103 (indicated in reverse direction on the vertical axis of diagram 400). Table 1 also shows the thickness of the indicated layer.

TABLE 1

Thermal Conductivity (W/cm/K) and Thickness for FIG. 4

| Layer | R direction | Z direction | Thickness (μm) |
|---|---|---|---|
| Active 104 | 0.1 | 0.1 | 1.2 |
| Bottom DBR 103 | 0.3625 | 0.1 | 9.5 |
| Substrate 102 | 0.68 | 0.68 | 100 |
| In mounting | 0.82 | 0.82 | 10 |
| Submount 101 | 4.1 | 4.1 | 2000 |

Also, the following assumptions were made: pumping power: 250 mW; pumping size diameter: 30 μm; 90% of pumping power absorbed in active region layer 104 to form active region 114, 10% absorbed by bottom DBR; submount temperature is maintained at 20° C.; using cylindrical symmetry with a device (chip) diameter of 1 mm. Numbers insider contour diagram indicate the simulated temperature (in ° C.) as a function of R and Z.

As can be seen in contour diagram 400, for a VCSEL such as VCSEL 110, with the above assumptions, the core active region temperature is 232° C.

Figure 5:
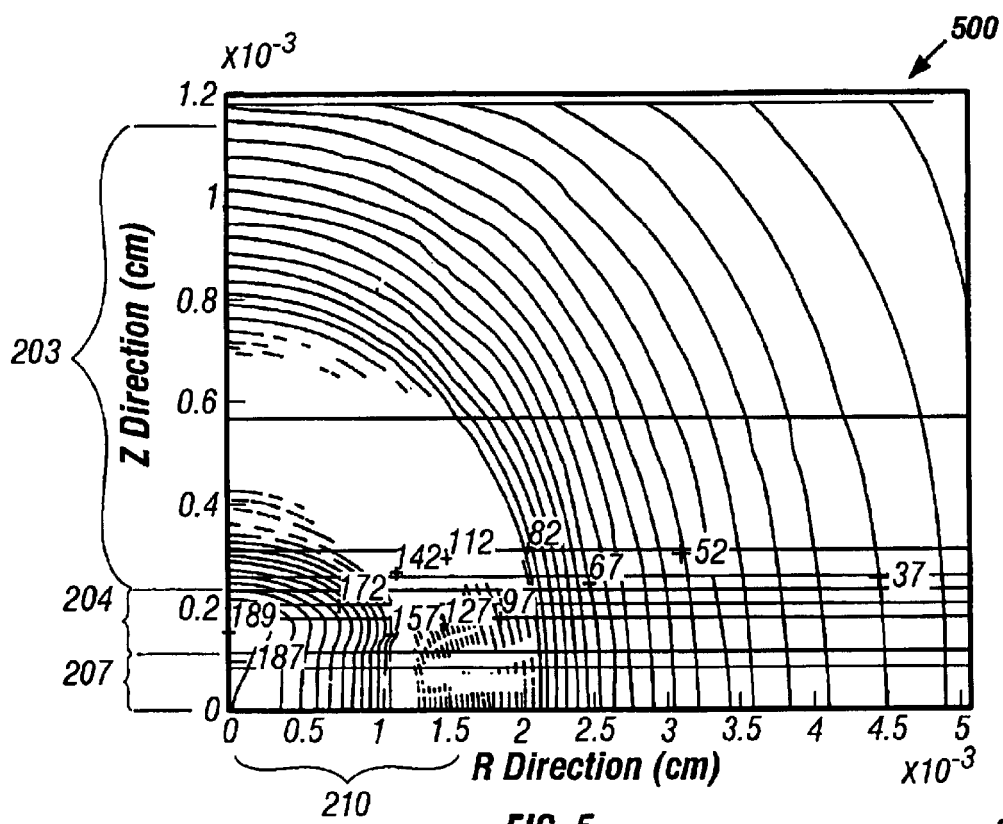
FIG. 5 is a contour diagram plotting simulated temperature in the active and surrounding regions of an OP VCSEL with heat spreading layer of FIG. 2.

Referring now to FIG. 5, there is shown a contour diagram 500 plotting simulated temperature in the active and surrounding regions of an OP VCSEL with heat-spreading layer, such as VCSEL 210 of array 200 of FIG. 2. Identical assumptions were made as for diagram 400 of FIG. 4, except that the existence of a 1 μm thick InP heat-spreading layer 207 was taken into account. The thermal conductivity and thickness assumptions shown in Table 2 below were made:

TABLE 2

Thermal Conductivity (W/cm/K) and Thickness for FIG. 5

| Layer | R direction | Z direction | Thickness (μm) |
|---|---|---|---|
| Thermal 207 | 0.68 | 0.68 | 1 |
| Active 204 | 0.1 | 0.1 | 1.2 |
| Bottom DBR 203 | 0.3625 | 0.1 | 9.5 |
| Substrate 202 | 0.68 | 0.68 | 100 |
| In mounting | 0.82 | 0.82 | 10 |
| Submount 201 | 4.1 | 4.1 | 2000 |

As can be seen in contour diagram 500, for a VCSEL such as VCSEL 210 with heat-spreading layer 207, with the above assumptions, the core active region temperature is about 189° C., i.e. about 232° C., about 20% cooler than VCSEL 110 (using submount temperature of 20° C. as a baseline). Similar simulations (not shown) run by changing only the thickness of the heat-spreading (thermal) layer 207 indicate better results for a thicker thermal layer, to wit: a core active region temperature of about 164° C. for a 2 μm thermal layer (about 32% cooler); and a core active region temperature of about 137° C. for a 4 μm thermal layer (about 45% cooler).

Figure 6:
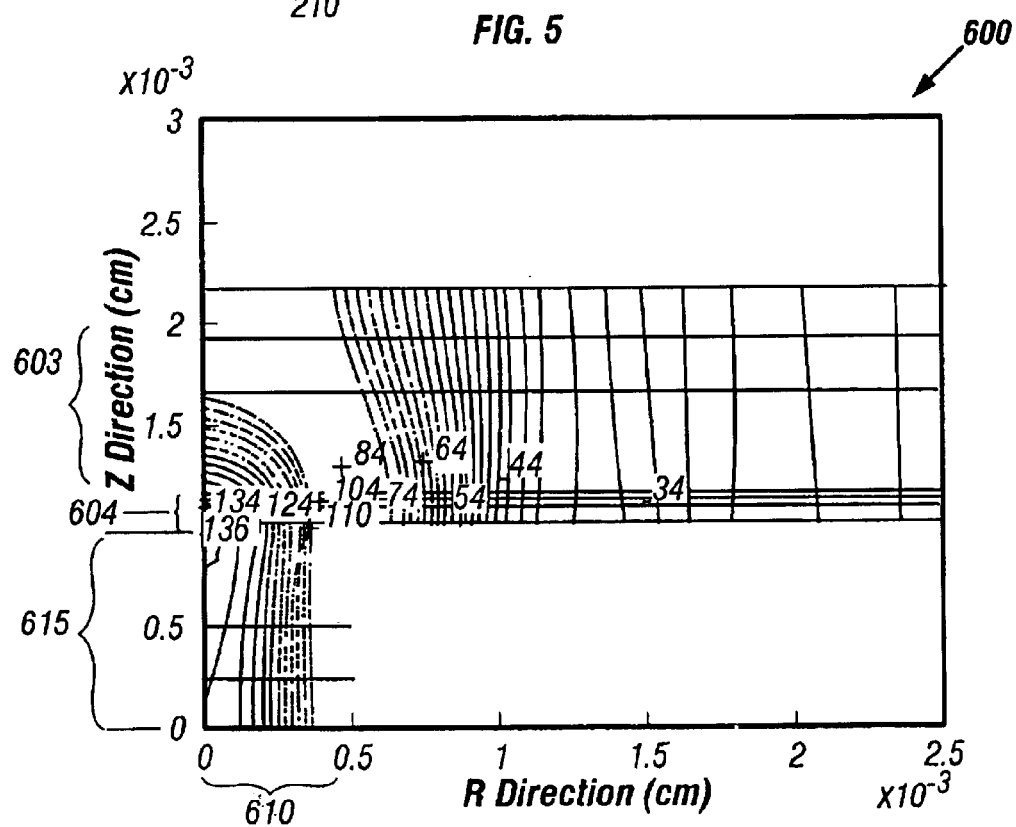
FIG. 6 is a contour diagram plotting simulated temperature in the active and surrounding regions of a conventional EP VCSEL.

Simulations also verified improved active region cooling for an EP VCSEL configuration. Referring now to FIG. 6, there is shown a contour diagram 600 plotting simulated temperature in the active and surrounding regions of a conventional EP VCSEL (not shown). The EP VCSEL simulated is similar in structure to that shown in FIG. 3 except there is no heat-spreading layer 307. Identical assumptions were made as for diagram 400, except as follows, and as shown in Table 3: the bottom DBR 603 is slightly smaller, the active region 604 is smaller, and a monolithic top (dielectric, e.g. Si/SiO$_2$) DBR 615 is included (see Table 3, below); input power of 20 mA*2V=40 mW; current size diameter is 10 μm; 100% heat in active region.

TABLE 3

Thermal Conductivity (W/cm/K) and Thickness for FIG. 6

| Layer | R direction | Z direction | Thickness ($\mu$m) |
|---|---|---|---|
| Top DBR 615 | 0.01 | 0.01 | 1 |
| Active 604 | 0.1 | 0.1 | 0.13 |
| Bottom DBR 603 | 0.3625 | 0.1 | 9.4 |
| Substrate 602 | 0.68 | 0.68 | 100 |
| In mounting | 0.82 | 0.82 | 10 |
| Submount 601 | 4.1 | 4.1 | 2000 |

As can be seen in contour diagram 600, for a conventional EP VCSEL, with the above assumptions, the core active region temperature is about 136° C.

Figure 7:
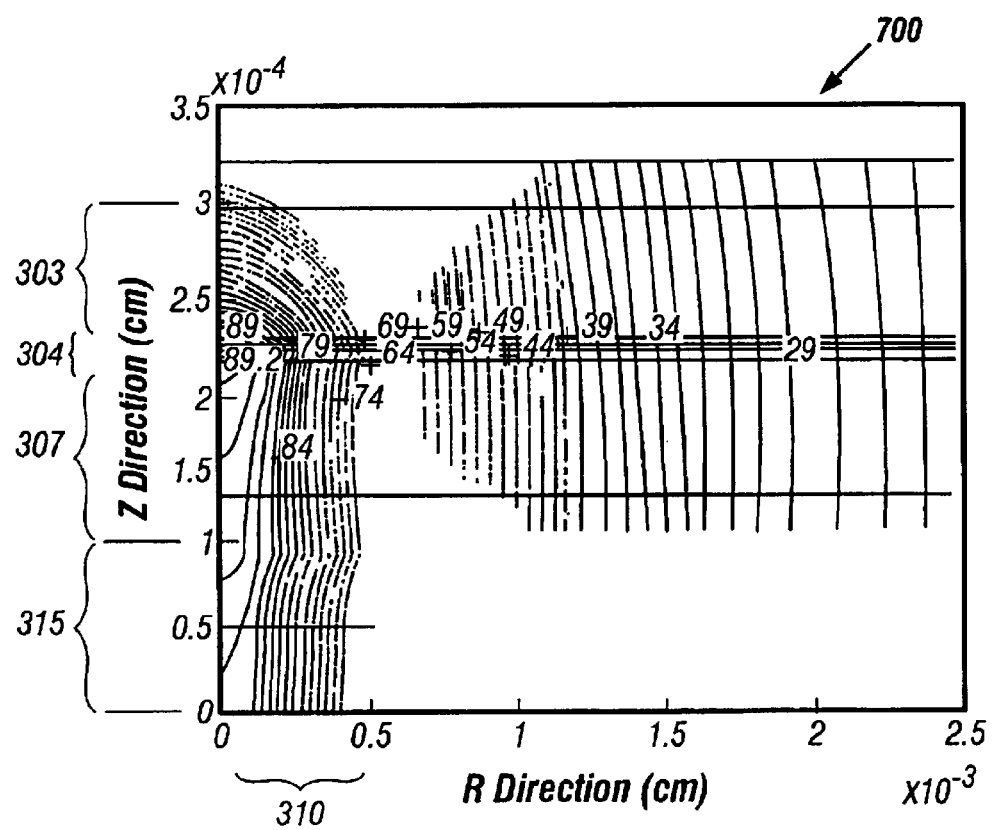
FIG. 7 is a contour diagram plotting simulated temperature in the active and surrounding regions of an EP VCSEL with heat spreading layer of FIG. 3.

Referring now to FIG. 7, there is shown a contour diagram 700 plotting simulated temperature in the active and surrounding regions of an EP VCSEL with heat-spreading layer, such as EP VCSEL 310 of FIG. 3. Identical assumptions were made as for diagram 600 of FIG. 6, except that the existence of a 1 $\mu$m thick InP heat-spreading layer 307 was taken into account, layer 307 having a thermal conductivity of 0.68 W/cm/K. As shown in diagram 700, the core active region temperature is about 89° C., i.e. about 40% cooler than that of the conventional EP VCSEL simulated in diagram 600. A similar simulation (not shown) run by changing only the thickness of the heat-spreading (thermal) layer 307 indicate better results for a thicker thermal layer, to-wit, a core active region temperature of about 74° C. for a 2 $\mu$m thermal layer (about 53.5% cooler).

Alternative Embodiments

In an embodiment, as shown in FIG. 2, top DBR 215 and the remaining portions of VCSEL 210 are monolithically integrated. In alternative embodiments, e.g., in an OP VCSEL, the VCSEL may be an external-cavity VCSEL (i.e., vertical external-cavity surface-emitting laser (VECSEL)) in which the top (exit) mirror is physically separated and mounted above the top surface of heat-spreading layer 207 with some gas-filled gap between.

In the OP VCSEL embodiments of the present invention illustrated above, VCSELs are part of an array of VCSELs and do not have independent mesas. Thus, heat from the active region of each VCSEL propagates out the side of each active region into the surrounding "unused" active region layer of the array, not only out of its bottom; heat also spreads from the active region through its top end into the portion of the heat-spreading layer directly above the active region, through the active region laterally and downward from the portions of the heat-spreading layer just outside the active region, into the portions of unused active region layer just outside the pumped part of the active region.

In the EP VCSEL embodiments disclosed above, a mesa is formed for the top DBR section only. In this case, heat-spreading layer 307 for each VCSEL has a wider diameter than the pumped active region for each VCSEL, so that it covers both the surface of the active region plus unused portions of the active region layer outside the active region itself. In one embodiment, heat-spreading layer 307 extends across the entire array and serves as a common layer for the entire EP VCSEL array. In another embodiment, there is a separate heat-spreading layer 307 for each VCSEL. In this latter embodiment, the "mesa" portion of each VCSEL may be considered to be its top DBR plus its heat-spreading layer. In alternative embodiments, a mesa for a VCSEL may be formed down to the bottom DBR layer, or even further, into the bottom DBR layer or all the way to the substrate. In this case, the heat-spreading layer preferably has a horizontal portion covering the top of the active region (and between the active region and the top DBR), and continues on to "spill" down the sides of the mesa walls, so that heat is carried out the top surface of the active region, and into the horizontal portion of the heat-spreading layer, where it then flows down the sides of the mesa walls of the VCSEL in the mesa wall portions of the heat-spreading layer, where it is then dissipated (spread) into layers of the VCSEL and/or array below the active region.

As disclosed above, heat-spreading layer 207 consists of InP in an embodiment. In alternative embodiments other suitable materials may be employed. For example, BeO might be employed, although its toxicity may be a disadvantage. A material such as SiC could also be used in alternative embodiments, although it can be more difficult to grow. Likewise, a layer of diamond could be used, although it can also be difficult, costly, or too impracticable.

Other doping densities than those specified above may be utilized in alternative embodiments, depending on design constraints and other factors and preferences.

Embodiments of the present invention comprising VCSELs have been described above. Alternative embodiments of the present invention encompass other light-emitting devices, such as light-emitting diodes (LEDs), which employ a heat-spreading layer on the active region. For example, there may be no top mirror, and/or no bottom mirror, but simply an active region disposed on a substrate, where the active region has a bottom surface (disposed on the substrate) and a top surface out of which light generated in the active region is emitted, with a heat-spreading layer disposed on this top surface to help control the temperature of the active region, as described above with respect to VCSEL embodiments. In such an embodiment, the invention comprises an active region for generating light and emitting light out of a top surface, the active region disposed on a substrate, and having a heat-spreading layer disposed on the top surface of the active region to remove heat therefrom. In addition to LEDs, other embodiments contemplate use of devices such as semiconductor optical amplifiers (SOAs), for example in which an active region is disposed on a transparent substrate and a heat-spreading layer is disposed on the light-emitting side of the active region; and input light is input into the active region through the substrate, where it is amplified and amplified light is output through its top, "exit" side, through the heat-spreading layer.

In embodiments described herein, the heat-spreading layer is in direct contact with the top (exit) surface of the active region. In an alternative embodiment, the heat-spreading layer may be disposed on the bottom side (surface) of the active region. For example, in a VCSEL embodiment, an InP heat-spreading layer may be disposed between the bottom DBR and the bottom surface of the active region, in direct contact with the active region. Because the heat-spreading layer has higher thermal conductivity from the active region via a bottom heat-spreading layer than would be removed in its absence. In another embodiment, both bottom and top heat-spreading layers may be employed.

Thus, the present invention comprises, generally, a device having a substrate, an active region, and a heat-spreading layer, where the device may be a VCSEL or LED (or array thereof), and the active region has a bottom and a top surface and is for emitting light out of its top surface. The active region is disposed on the substrate at its bottom surface, where "disposed on" includes embodiments where the active region is (indirectly) disposed on the substrate via one or more intervening layers, such as a bottom DBR. The heat-spreading layer is disposed (directly) on a surface of the active region and is in contact with material outside the active region, for removing heat from the active region. For example, the heat-spreading layer may be disposed on the top surface of the active region and also extends beyond the extent of the active region for the VCSEL, to contact other layers of the array outside the active region, into which heat conducted by the layer from the active region can be carried. The invention includes embodiments where the heat-spreading layer is disposed on either the top or bottom surface of the active region, and also embodiments having two heat-spreading layers, one on each surface of the active region. When the heat-spreading layer is mounted on the top surface of the active region, the top DBR is mounted indirectly on the top of the active region, with at least the heat-spreading layer interposed therebetween.

In the present application, a "non-section-112(6) means" for performing a specified function is not intended to be a means under 35 U.S.C. section 112, paragraph 6, and refers to any means that performs the function. Such a non-section-112(6) means is in contrast to a "means for" element under 35 U.S.C. section 112, paragraph 6 (i.e., a "section-112(6) means"), which literally covers only the corresponding structure, material, or acts described in the specification and equivalents thereof.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all respects.

What is claimed is:

1. A laser structure, comprising:

a substrate;

a bottom mirror disposed on the substrate;

an active region layer means for generating light in response to optical pumping, the active region layer means comprising active region material and having a bottom and a top surface;

an optical pumping means for pumping light into an active region section of the active region layer means to cause the active region section to generate light therein and to emit said light out of its top surface, wherein the active region section is adjacent portions of the active region layer means outside the active region section, wherein the active region layer means is disposed at its bottom surface on the bottom mirror;

a heat-spreading layer disposed directly on the top surface of the active region on the active region section and the portions of the active region layer outside the active region, the heat-spreading layer comprised of a material having a thermal conductivity greater than that of the active region layer means whereby sonic of the heat generated in the active region section during optical pumping thereof by said optical pumping means is conducted from the top surface of the active region section into the portions of the active region layer outside the active region via the heat-spreading layer;

a top mirror disposed above the heat-spreading layer such that the active region section is interposed between the top mirror and the bottom mirror.

2. The laser structure of claim 1, wherein the heat-spreading layer has a thickness between about 1 μm and 4 μm.

3. The laser structure of claim 2, wherein the heat-spreading layer consists of InP.

4. The laser structure of claim 1, further comprising a second heat-spreading layer disposed directly on the bottom surface of the active region, between the active region section and the bottom mirror.

5. The laser structure of claim 1, wherein the heat-spreading layer has a thermal conductivity of about 0.68 W/cm/K.

6. The laser structure of claim 1, wherein the top mirror comprises a top distributed Bragg reflector (DBR) and the bottom mirror comprises a bottom DBR.

7. The laser structure of claim 6, wherein:

the top and bottom DBRs are for at least partially reflecting light at a wavelength and the active region section is for generating light at the wavelength; and the heat-spreading layer is substantially transparent to light at the wavelength.

8. The laser structure of claim 6, wherein the top DBR comprises a dielectric top DBR and the bottom DBR comprises a semiconductor bottom DBR, wherein the heat-spreading layer has a thermal conductivity greater than that of the top DBR and greater than that of the bottom DBR.

9. The laser structure of claim 1, wherein the top mirror is mounted above the heat-spreading layer with a gap between the top mirror and the heat-spreading layer, wherein the laser structure comprises a vertical external-cavity surface-emitting laser.

10. The laser structure of claim 1, wherein the active region layer means comprises an array of active regions sections, including the active region section, the active region layer means being disposed at a bottom surface thereof on the bottom mirror, wherein the heat-spreading layer is disposed directly on the top surface of each active region section of the array and on portions of the active region layer means outside each active region section of the array.

* * * * *